(12) United States Patent
Wang et al.

(10) Patent No.: US 7,876,593 B2
(45) Date of Patent: Jan. 25, 2011

(54) LED CHIP PACKAGE STRUCTURE WITH AN EMBEDDED ESD FUNCTION AND METHOD FOR MANUFACTURING THE SAME

(75) Inventors: Bily Wang, Hsinchu (TW); Ping-Chou Yang, Yonghe (TW); Jia-Wen Chen, Changhua (TW)

(73) Assignee: Harvatek Corporation, Hsinchu (TW)

( * ) Notice: Subject to any disclaimer, the term of this patent is extended or adjusted under 35 U.S.C. 154(b) by 248 days.

(21) Appl. No.: 12/243,016

(22) Filed: Oct. 1, 2008

(65) Prior Publication Data

US 2009/0316315 A1    Dec. 24, 2009

(30) Foreign Application Priority Data

Jun. 18, 2008    (TW) ............................... 97122684 A

(51) Int. Cl.
*H01L 33/00* (2010.01)
*H01L 21/00* (2010.01)
*H02H 9/00* (2006.01)

(52) U.S. Cl. .......................................... 365/56; 257/99

(58) Field of Classification Search .................... 257/13, 257/79–103, 918, E51.018–E51.022, E33.001–E33.077, 257/E33.054, E25.028, E31.058, E31.063, 257/E31.115, E25.032, E27.133–E27.139; 438/22–47, 69, 493, 503, 507, 956; 361/56
See application file for complete search history.

(56) References Cited

U.S. PATENT DOCUMENTS

| | | | |
|---|---|---|---|
| 7,244,965 B2 * | 7/2007 | Andrews et al. ............... 257/98 |
| 7,501,660 B2 * | 3/2009 | Schmid et al. ................. 257/81 |
| 7,679,090 B2 * | 3/2010 | Huang et al. ................... 257/81 |
| 7,714,349 B2 * | 5/2010 | Su ............................... 257/99 |
| 2007/0194343 A1 * | 8/2007 | Jang et al. .................... 257/103 |
| 2008/0099779 A1 * | 5/2008 | Huang et al. ................... 257/99 |
| 2009/0026470 A1 * | 1/2009 | Lai et al. ....................... 257/98 |
| 2009/0257468 A1 * | 10/2009 | McMahan .................... 372/107 |
| 2009/0278441 A1 * | 11/2009 | Braune et al. ................ 313/503 |
| 2009/0290902 A1 * | 11/2009 | Amico et al. ................. 399/107 |
| 2010/0032709 A1 * | 2/2010 | Huang et al. ................... 257/99 |
| 2010/0044739 A1 * | 2/2010 | Reeh et al. ...................... 257/98 |
| 2010/0084683 A1 * | 4/2010 | Lai et al. ....................... 257/99 |
| 2010/0176344 A1 * | 7/2010 | Hohn et al. ............ 252/301.36 |

* cited by examiner

*Primary Examiner*—Dao H Nguyen
*Assistant Examiner*—Tram H Nguyen
(74) *Attorney, Agent, or Firm*—Rosenberg, Klein & Lee

(57) ABSTRACT

An LED chip package structure includes a conductive unit, a first package unit, an ESD unit, a second package unit, a light-emitting unit and a second package unit. The conductive unit has two conductive pins adjacent to each other which form a concave space between each other. The first package unit encloses one part of each conductive pin in order to form a receiving space communicating with the concave space and to expose an end side of each conductive pin. The ESD unit is received in the concave space and electrically connected between the two conductive pins. The second package unit is received in the concave space in order to cover the ESD unit. The light-emitting unit is received in the receiving space and electrically connected between the two conductive pins. The third package unit is received in the receiving space in order to cover the light-emitting unit.

10 Claims, 7 Drawing Sheets

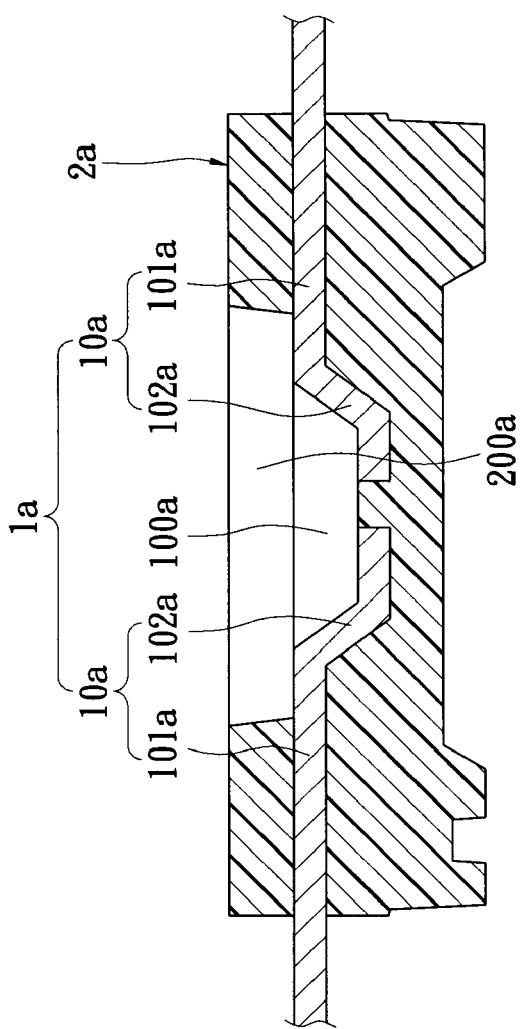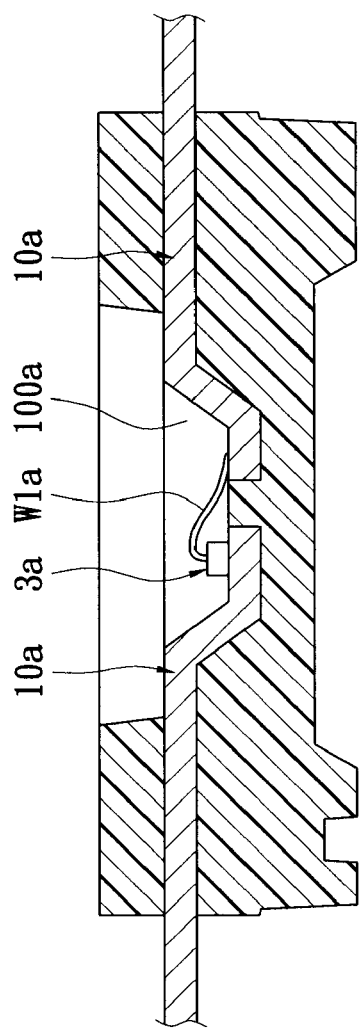
FIG. 2A
FIG. 2B

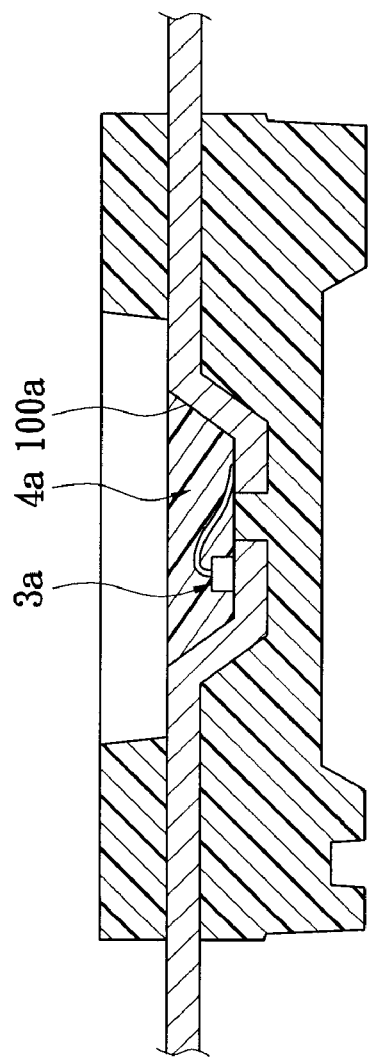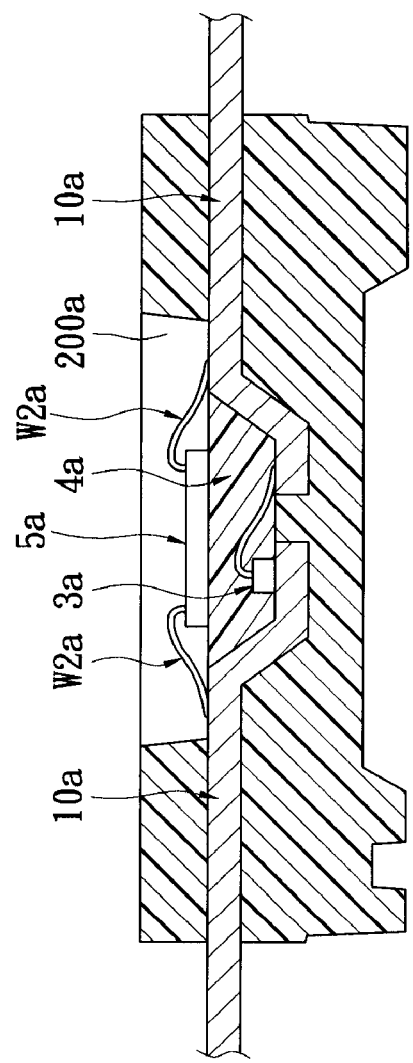

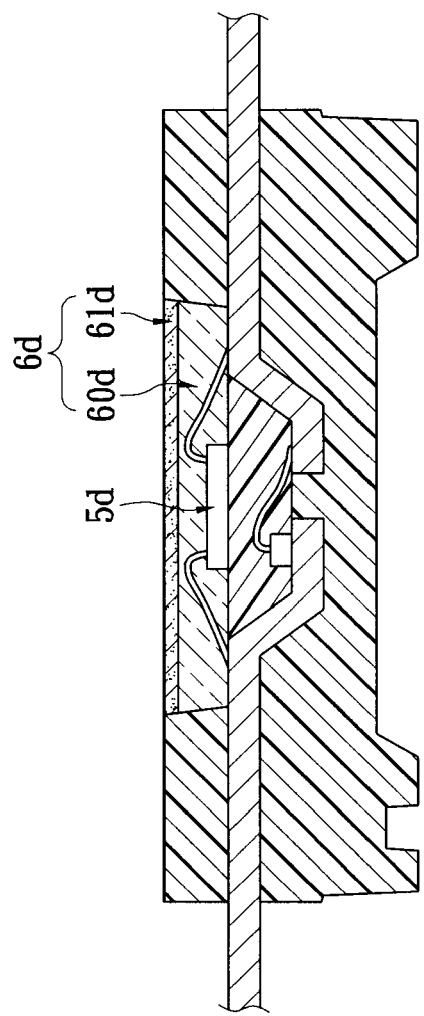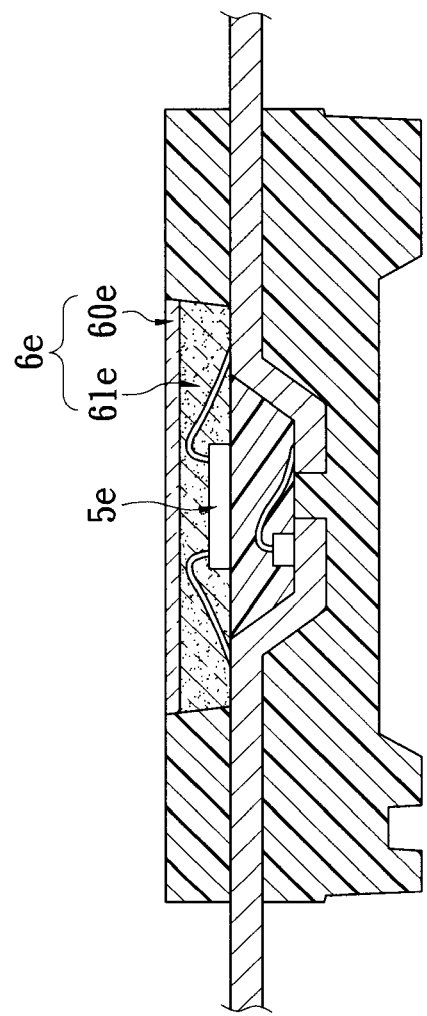

LED CHIP PACKAGE STRUCTURE WITH AN EMBEDDED ESD FUNCTION AND METHOD FOR MANUFACTURING THE SAME

BACKGROUND OF THE INVENTION

1. Field of the Invention

The present invention relates to an LED chip package structure and a method for manufacturing the same, and particularly relates to an LED chip package structure with an embedded ESD (Electro-Static Discharge) function and a method for manufacturing the same.

2. Description of Related Art

Referring to FIG. 1, the prior art provides an LED chip package structure including: a substrate structure 1, at least one LED (light-emitting diode) 2 disposed on the substrate structure 1, an ESD device 3, and a fluorescent body 4.

The LED 2 has a positive electrode 21 and a negative electrode 22 respectively electrically connected to a positive electrode 11 and a negative electrode 12 of the substrate structure 1 via two lead wires W1. The ESD device 3 is disposed on the substrate structure 1. The negative electrode 32 of the ESD device 3 is directly electrically connected to the positive electrode 11 of the substrate structure 1, and the positive electrode 31 of the ESD device 3 is electrically connected to the negative electrode 12 of the substrate structure 1 via a lead wire W2. In addition, the fluorescent body 4 covers the LED 2 and the ESD device 3 in order to protect the LED 2 and the ESD device 3.

However, the LED chip package structure of the prior art has the following defects:

1. Because the position of the LED 2 is over low, the light-emitting efficiency of the LED 2 cannot be increased effectively.

2. Because the ESD device 3 is disposed close to the LED 2, the light-emitting efficiency of the LED 2 is affected by the ESD device 3.

3. Because the LED 2 and the ESD device 3 are disposed on the same conductive pin of the substrate structure 1, the heat-dissipating efficiency of the LED 2 is affected by the ESD device 3.

SUMMARY OF THE INVENTION

One particular aspect of the present invention is to provide an LED chip package structure with an embedded ESD function and a method for manufacturing the same. The present invention makes an ESD unit and a light-emitting unit separated from each other and respectively disposed on two different layers, so that the light-emitting unit does not be affected by the ESD unit.

Moreover, because a fluorescent layer does not contact with the light-emitting unit, the present invention can prevent the light-emitting efficiency of the fluorescent layer from being decreased due to the high temperature generated by the light-emitting unit.

Furthermore, the LED chip package structure can be applied to any type of light source such as a back light module, a decorative lamp, a lighting lamp, or a scanner.

In order to achieve the above-mentioned aspects, the present invention provides an LED chip package structure with an embedded ESD (Electro-Static Discharge) function, including: a conductive unit, a first package unit, an ESD unit, a second package unit, a light-emitting unit and a second package unit. The conductive unit has at least two conductive pins adjacent to each other which form a concave space between each other. The first package unit encloses one part of each conductive pin in order to form a receiving space that communicates with the concave space and to expose an end side of each conductive pin. The ESD unit is received in the concave space and electrically connected between the two conductive pins. The second package unit is received in the concave space in order to cover the ESD unit. The light-emitting unit is received in the receiving space and electrically connected between the two conductive pins. The third package unit is received in the receiving space in order to cover the light-emitting unit.

In order to achieve the above-mentioned aspects, the present invention provides a method for manufacturing an LED chip package structure with an embedded ESD (Electro-Static Discharge) function, including: providing a conductive unit that has at least two conductive pins adjacent to each other which form a concave space between each other; enclosing one part of each conductive pin by a first package unit in order to form a receiving space that communicates with the concave space and to expose an end side of each conductive pin; receiving an ESD unit in the concave space and electrically connecting the ESD unit between the two conductive pins; receiving a second package unit in the concave space in order to cover the ESD unit; receiving a light-emitting unit in the receiving space and electrically connecting the light-emitting unit between the two conductive pins; and receiving a third package unit in the receiving space in order to cover the light-emitting unit.

Moreover, the third package unit has following four choices according to different requirements:

The first embodiment: The third package unit is made of a transparent material.

The second embodiment: The third package unit is made of a fluorescent material, and the fluorescent material is formed by mixing silicone and fluorescent powders or mixing epoxy and fluorescent powders.

The third embodiment: The third package unit has a transparent layer covering the light-emitting unit and a fluorescent layer formed on the transparent layer.

The fourth embodiment: The third package unit has fluorescent layer covering the light-emitting unit and a transparent layer formed on the fluorescent layer.

Hence, the present invention has the following advantages:

1. The light-emitting unit is positioned at a higher position by the support of the second package unit. Hence, the light-emitting efficiency of the light-emitting unit can be increased.

2. The ESD unit and the light-emitting unit are separated from each other and are respectively disposed on two different layers, so that the light-emitting efficiency of the light-emitting unit does not be affected by the ESD unit.

3. The ESD unit and the light-emitting unit are separated from each other and are respectively disposed on two different layers, so that the heat-dissipating efficiency of the light-emitting unit does not be affected by the ESD unit.

4. Because the fluorescent layer does not contact with the light-emitting unit, the present invention can prevent the light-emitting efficiency of the fluorescent layer from being decreased due to the high temperature generated by the light-emitting unit.

5. The quantity of the fluorescent layer can be decreased by using the transparent layer, and the transparent layer can prevent the fluorescent layer from being damaged by external force.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIGS. 2A to 2E are cross-sectional views of an LED chip package structure with an embedded ESD function according to the first embodiment of the present invention, at different stages of the packaging processes, respectively;

FIG. 5 is a cross-sectional view of an LED chip package structure with an embedded ESD function according to the fourth embodiment of the present invention; and FIG. 6 is a cross-sectional view of an LED chip package structure with an embedded ESD function according to the fifth embodiment of the present invention.

DETAILED DESCRIPTION OF PREFERRED EMBODIMENTS

Figure 1:
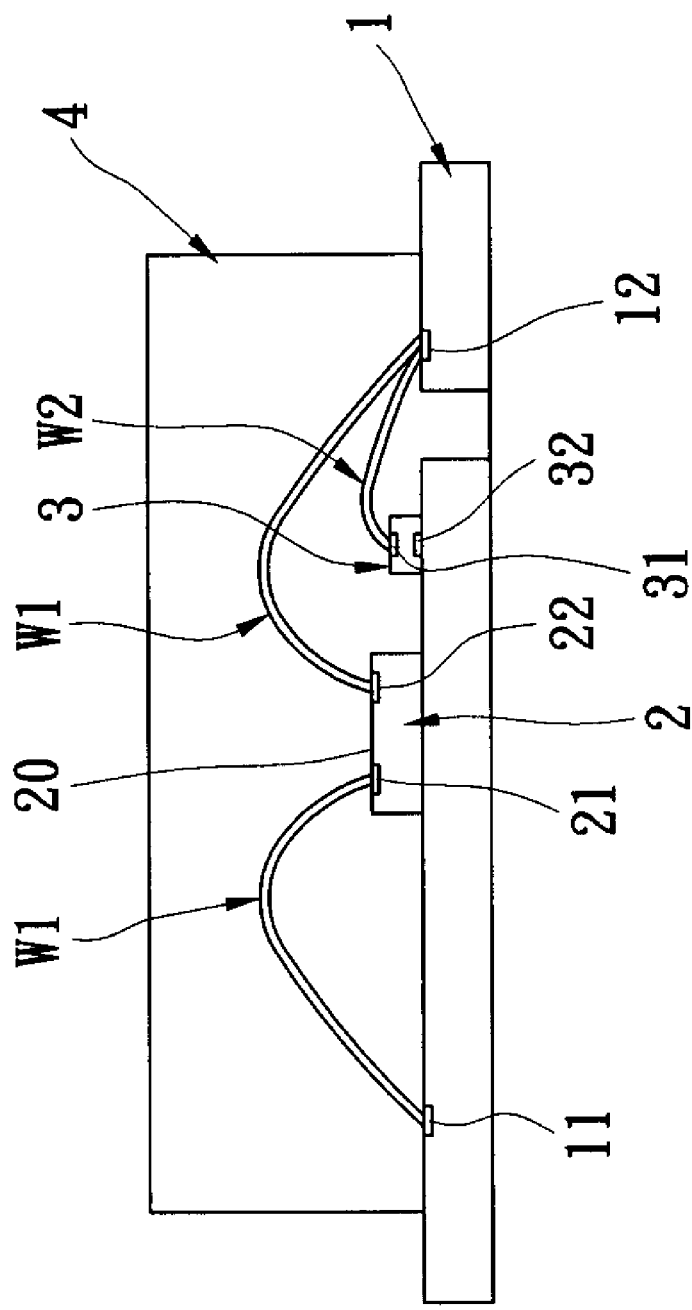
FIG. 1 is a lateral, schematic view of an LED chip package structure with an embedded ESD function of the prior art.
Figure 2:
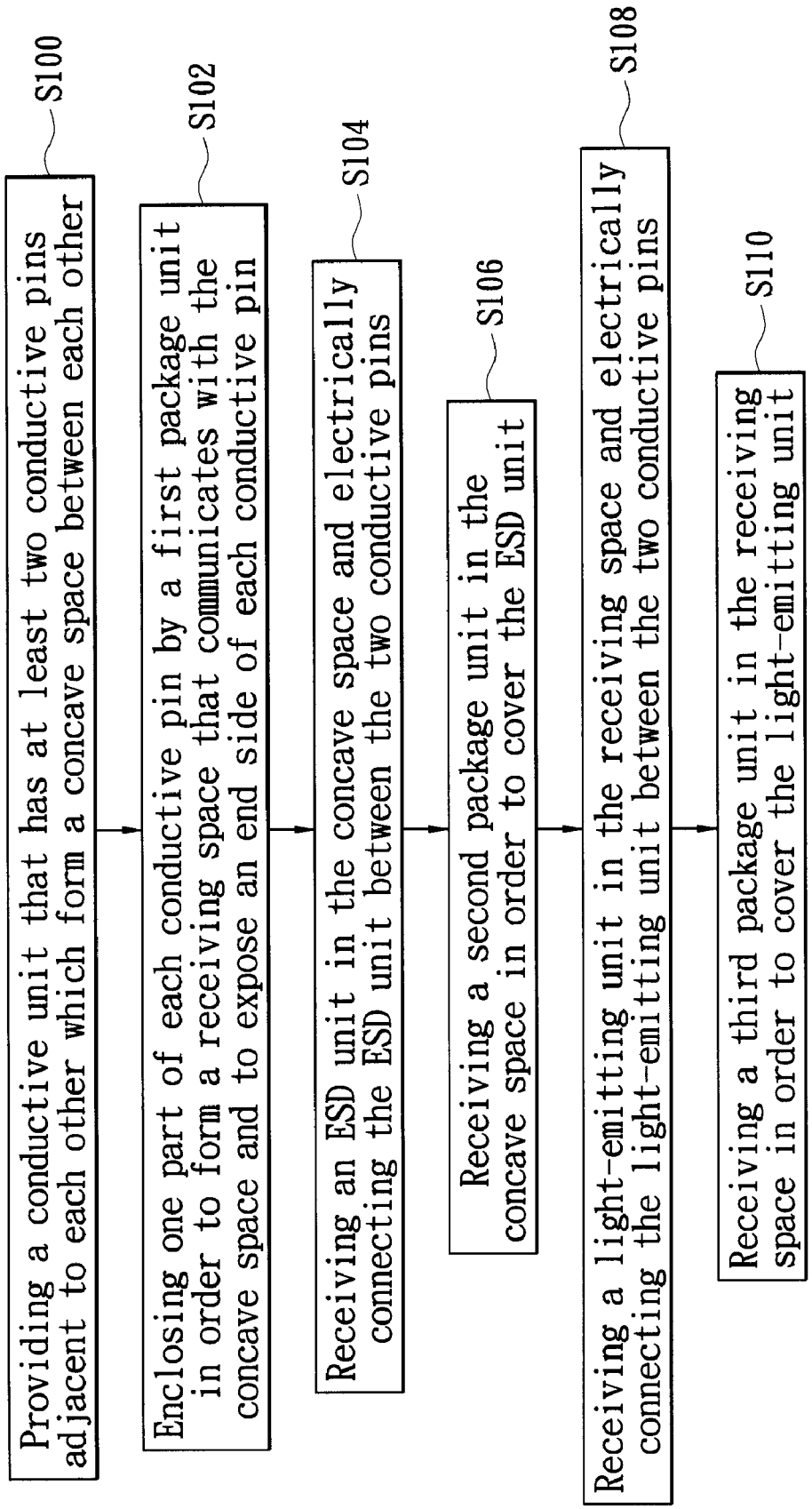
FIG. 2 is a flowchart of a method for manufacturing an LED chip package structure with an embedded ESD function according to the first embodiment of the present invention.

Referring to FIGS. 2, and 2A to 2E, the first embodiment of the present invention provides a method for manufacturing an LED chip package structure with an embedded ESD (Electro-Static Discharge) function. The method includes the following steps:

The step S100 is: referring to FIGS. 2 and 2A, providing a conductive unit 1a that has at least two conductive pins 10a adjacent to each other which form a concave space 100a between each other. In addition, each conductive pin 10a has an extending portion 101a and a bending portion 102a bent downwards from the extending portion 101a, and the concave space 100a is formed between the two bending portions 102a that are adjacent to each other.

The step S102 is: referring to FIGS. 2 and 2A, enclosing one part of each conductive pin 10a by a first package unit 2a in order to form a receiving space 200a that communicates with the concave space 100a and to expose an end side of each conductive pin 10a. In other words, one side of each extending portion 101a is extended beyond the first package unit 2a, and the first package unit 2a can be made of an opaque material.

The step S104 is: referring to FIGS. 2 and 2B, receiving an ESD unit 3a in the concave space 100a and electrically connecting the ESD unit 3a between the two conductive pins 10a. In the first embodiment, the ESD unit 3a is electrically disposed on one of the two conductive pins 10a and is electrically connected to the other conductive pin 10a via a lead wire W1a.

The step S106 is: referring to FIGS. 2 and 2C, receiving a second package unit 4a in the concave space 100a in order to cover the ESD unit 3a. In addition, the second package unit 4a can be made of a package material with light-reflecting substance, such as high reflection substance or total reflection substance.

The step S108 is: referring to FIGS. 2 and 2D, receiving a light-emitting unit 5a in the receiving space 200a and electrically connecting the light-emitting unit 5a between the two conductive pins 10a. In addition, the light-emitting unit 5a can be an LED (light-emitting diode). The light-emitting unit 5a is electrically disposed on the second package unit 4a, and the light-emitting unit 5a is electrically connected to the two conductive pins 10a via two lead wires W2a. The light-emitting unit 5a can generate high reflective effect by the high reflection property of the second package unit 4a. Moreover, the light-emitting unit 5a can be positioned at a higher position by the support of the second package unit 4a. Hence, the light-emitting efficiency of the light-emitting unit 5a can be increased. Furthermore, the ESD unit 3a and the light-emitting unit 5a are separated from each other and are respectively disposed on two different layers, so that the light-emitting efficiency and the heat-dissipating efficiency of the light-emitting unit 5a do not be affected by the ESD unit 3a.

Figure 2E:
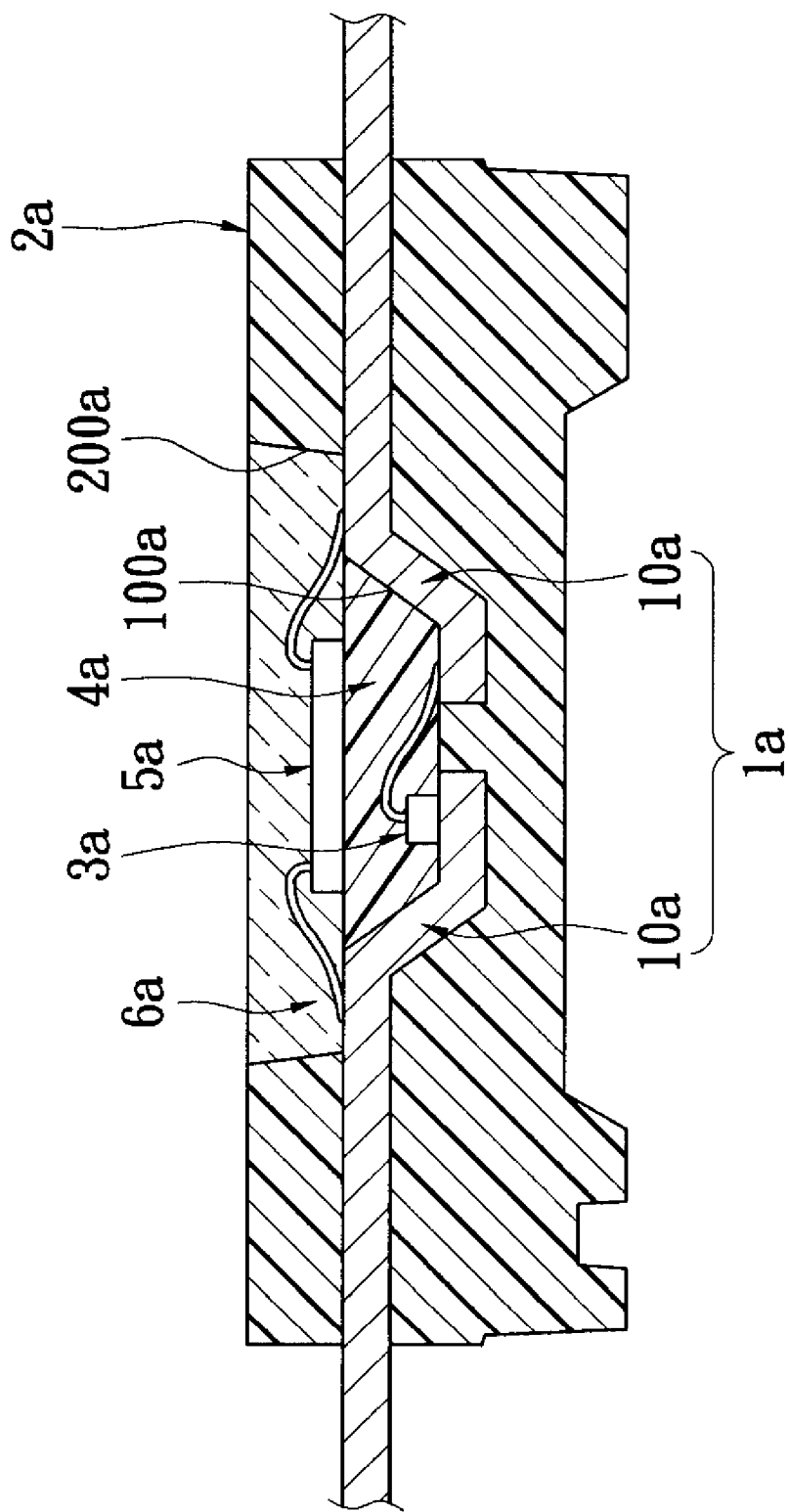

The step S110 is: referring to FIGS. 2 and 2E, receiving a third package unit 6a in the receiving space 200a in order to cover the light-emitting unit 5a. In the first embodiment, the third package unit 6a is made of a transparent material.

Referring to FIG. 2E, the first embodiment provides an LED chip package structure with an embedded ESD (Electro-Static Discharge) function, including: a conductive unit 1a, a first package unit 2a, an ESD unit 3a, a second package unit 4a, a light-emitting unit 5a and a second package unit 6a. The conductive unit 1a has at least two conductive pins 10a adjacent to each other which form a concave space 100a between each other. The first package unit 2a encloses one part of each conductive pin 10a in order to form a receiving space 200a that communicates with the concave space 100a and to expose an end side of each conductive pin 10a. The ESD unit 3a is received in the concave space 100a and electrically connected between the two conductive pins 10a. The second package unit 4a is received in the concave space 100a in order to cover the ESD unit 3a. The light-emitting unit 5a is received in the receiving space 200a and electrically connected between the two conductive pins 10a. The third package unit 6a is received in the receiving space 200a in order to cover the light-emitting unit 5a.

Figure 3:
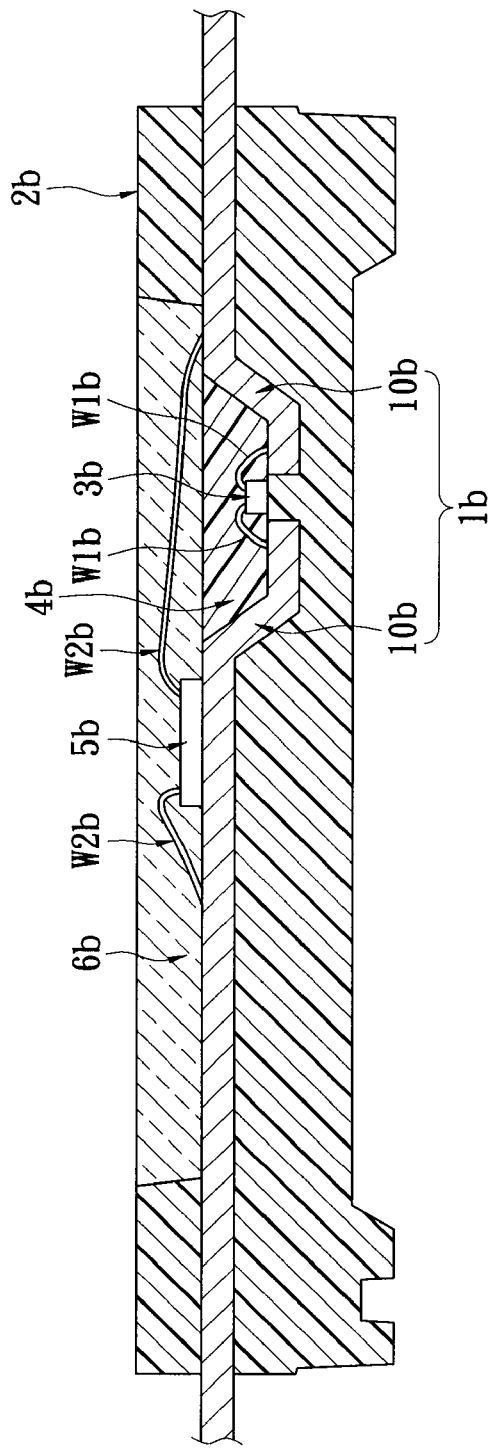
FIG. 3 is a cross-sectional view of an LED chip package structure with an embedded ESD function according to the second embodiment of the present invention.

Referring to FIG. 3, the second embodiment provides an LED chip package structure with an embedded ESD (Electro-Static Discharge) function, including: a conductive unit 1b, a first package unit 2b, an ESD unit 3b, a second package unit 4b, a light-emitting unit 5b and a second package unit 6b. The difference between the second embodiment and the first embodiment is that: in the second embodiment, the ESD unit 3b is electrically disposed on the first package unit 2b, so that the ESD unit 3b is electrically connected to two conductive pins 10a of the conductive unit 1b via two lead wires W1b. In addition, the light-emitting unit 5b is electrically disposed on one of the two conductive pins 10b via a lead wire W2b and is electrically connected to the other conductive pin 10b via another lead wire W2b.

Figure 4:
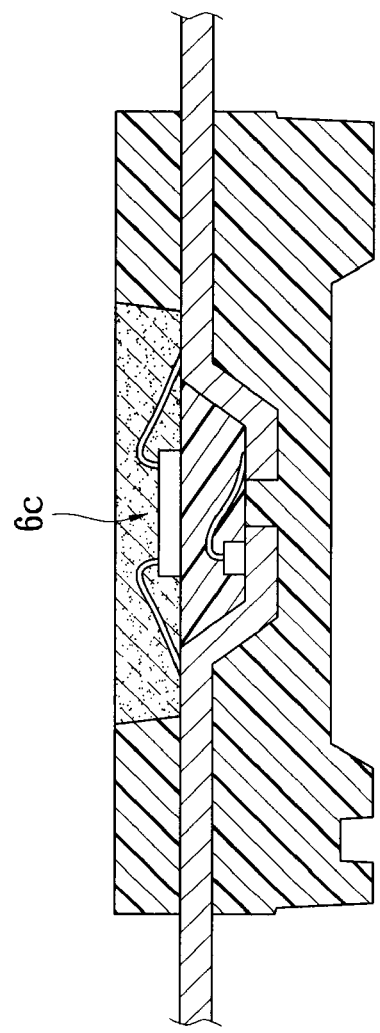
FIG. 4 is a cross-sectional view of an LED chip package structure with an embedded ESD function according to the third embodiment of the present invention.

Referring to FIG. 4, the difference between the third embodiment and the first embodiment is that: in the third embodiment, a third package unit 6c is made of a fluorescent material, and the fluorescent material can be formed by mixing silicone and fluorescent powders or mixing epoxy and fluorescent powders.

Referring to FIG. 5, the difference between the fourth embodiment and the first embodiment is that: in the fourth embodiment, a third package unit 6d has a transparent layer 60d covering a light-emitting unit 5d and a fluorescent layer 61d formed on the transparent layer 60d. Hence, the third package unit 6d is composed of the transparent layer 60d and the fluorescent layer 61d. Because the fluorescent layer 61d does not contact with the light-emitting unit 5d, the present invention can prevent the light-emitting efficiency of the fluorescent layer 61d from being decreased due to the high temperature generated by the light-emitting unit 5d.

Referring to FIG. 6, the difference between the fifth embodiment and the first embodiment is that: in the fifth embodiment, a third package unit 6e has fluorescent layer 61e covering a light-emitting unit 5e and a transparent layer 60e formed on the fluorescent layer 61e. In addition, the quantity of the fluorescent layer 61e can be decreased by using the transparent layer 60e, and the transparent layer 60e can prevent the fluorescent layer 61e from being damaged by external force.

In conclusion, the present invention makes the ESD unit and the light-emitting unit separated from each other and respectively disposed on two different layers, so that the present invention has the following advantages:

1. The light-emitting unit is positioned at a higher position by the support of the second package unit. Hence, the light-emitting efficiency of the light-emitting unit can be increased.

2. The ESD unit and the light-emitting unit are separated from each other and are respectively disposed on two different layers, so that the light-emitting efficiency of the light-emitting unit does not be affected by the ESD unit.

3. The ESD unit and the light-emitting unit are separated from each other and are respectively disposed on two different layers, so that the heat-dissipating efficiency of the light-emitting unit does not be affected by the ESD unit.

4. Because the fluorescent layer 61d does not contact with the light-emitting unit 5d, the present invention can prevent the light-emitting efficiency of the fluorescent layer 61d from being decreased due to the high temperature generated by the light-emitting unit 5d.

5. The quantity of the fluorescent layer 61e can be decreased by using the transparent layer 60e, and the transparent layer 60e can prevent the fluorescent layer 61e from being damaged by external force.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An LED chip package structure with an embedded ESD (Electro-Static Discharge) function, comprising:

a conductive unit having at least two conductive pins adjacent to each other which form a concave space between each other;

a first package unit enclosing one part of each conductive pin in order to form a receiving space that communicates with the concave space and to expose an end side of each conductive pin;

an ESD unit received in the concave space and electrically connected between the two conductive pins;

a second package unit received in the concave space in order to cover the ESD unit;

a light-emitting unit received in the receiving space and electrically connected between the two conductive pins; and a third package unit received in the receiving space in order to cover the light-emitting unit.

2. The LED chip package structure as claimed in claim 1, wherein each conductive pin has an extending portion and a bending portion bent downwards from the extending portion, one side of the extending portion is extended beyond the first package unit, and the concave space is formed between the two bending portions that are adjacent to each other.

3. The LED chip package structure as claimed in claim 1, wherein the ESD unit is electrically disposed on one of the two conductive pins.

4. The LED chip package structure as claimed in claim 1, wherein the ESD unit is electrically disposed on the first package unit.

5. The LED chip package structure as claimed in claim 1, wherein the light-emitting unit is electrically disposed on one of the two conductive pins.

6. The LED chip package structure as claimed in claim 1, wherein the light-emitting unit is electrically disposed on the second package unit.

7. The LED chip package structure as claimed in claim 1, wherein the first package unit is made of an opaque material, and the second package unit is made of a package material with light-reflecting substance.

8. The LED chip package structure as claimed in claim 1, wherein the third package unit is made of a transparent material or a fluorescent material, and the fluorescent material is formed by mixing silicone and fluorescent powders or mixing epoxy and fluorescent powders.

9. The LED chip package structure as claimed in claim 1, wherein the third package unit has a transparent layer covering the light-emitting unit and a fluorescent layer formed on the transparent layer.

10. The LED chip package structure as claimed in claim 1, wherein the third package unit has fluorescent layer covering the light-emitting unit and a transparent layer formed on the fluorescent layer.

* * * * *